(12) United States Patent
Stephanson et al.

(10) Patent No.: US 10,976,381 B2
(45) Date of Patent: Apr. 13, 2021

(54) MAGNETIC FIELD MONITOR HAVING AUTOMATED QUANTITATIVE CALIBRATION OF MAGNETIC FIELD SENSOR

(71) Applicant: MIS SECURITY, LLC, Tallahassee, FL (US)

(72) Inventors: Cory J. Stephanson, La Selva Beach, CA (US); Scott A. Sterling, Santa Cruz, CA (US)

(73) Assignee: MIS SECURITY, LLC, Tallahassee, FL (US)

( * ) Notice: Subject to any disclaimer, the term of this patent is extended or adjusted under 35 U.S.C. 154(b) by 126 days.

(21) Appl. No.: 16/408,601

(22) Filed: May 10, 2019

(65) Prior Publication Data

US 2020/0355754 A1 Nov. 12, 2020

(51) Int. Cl.
| | |
|---|---|
| *G01R 33/00* | (2006.01) |
| *G01R 33/028* | (2006.01) |
| *H01F 27/28* | (2006.01) |
| *H01F 17/04* | (2006.01) |

(52) U.S. Cl.
CPC ....... *G01R 33/0035* (2013.01); *G01R 33/028* (2013.01); *H01F 17/04* (2013.01); *H01F 27/2823* (2013.01)

(58) Field of Classification Search
None
See application file for complete search history.

(56) References Cited

U.S. PATENT DOCUMENTS

| | | | |
|---|---|---|---|
| 4,825,166 A | 4/1989 | MacGugan | |
| 5,428,888 A | 7/1995 | Hernandez-Ros et al. | |
| 5,689,182 A | 11/1997 | Togo et al. | |
| 8,723,509 B2 | 5/2014 | Patterson, III et al. | |
| 8,729,891 B2 | 5/2014 | Stephanson et al. | |
| 9,354,291 B2 | 5/2016 | Stephanson | |
| 9,812,588 B2 | 11/2017 | Vig et al. | |
| 10,107,872 B2 | 10/2018 | Stephanson | |
| 10,165,228 B2 | 12/2018 | Stephanson | |
| 2012/0206143 A1* | 8/2012 | McGushion | G01R 33/022 324/318 |

FOREIGN PATENT DOCUMENTS

| | | |
|---|---|---|
| KR | 10-2009-0100555 | 9/2009 |
| KR | 10-2017-0021663 | 2/2017 |

* cited by examiner

*Primary Examiner* — Paresh Patel
(74) *Attorney, Agent, or Firm* — Allen, Dyer, Doppelt + Gilchrist, P.A.

(57) ABSTRACT

A magnetic field monitor includes a magnetic field sensor that generates an electronic signal at a time period representing a magnetic field of the environment and includes a sensor transducer having a sensor bobbin, a primary coil, a secondary, over-winding coil, a sensor circuit, a controller connected to the primary coil, and a digitally controlled potentiometer connected to the secondary coil and controller. A non-linear output is converted to a quantitative linear output.

24 Claims, 12 Drawing Sheets

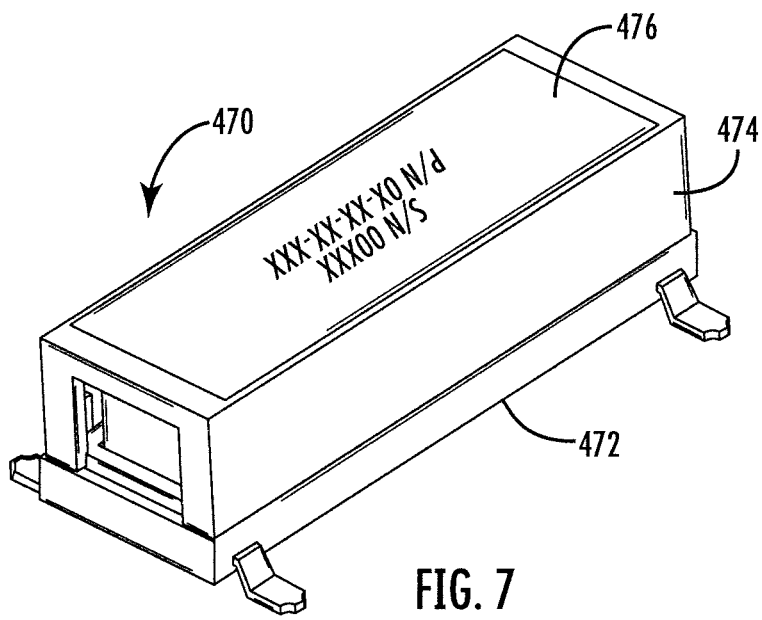
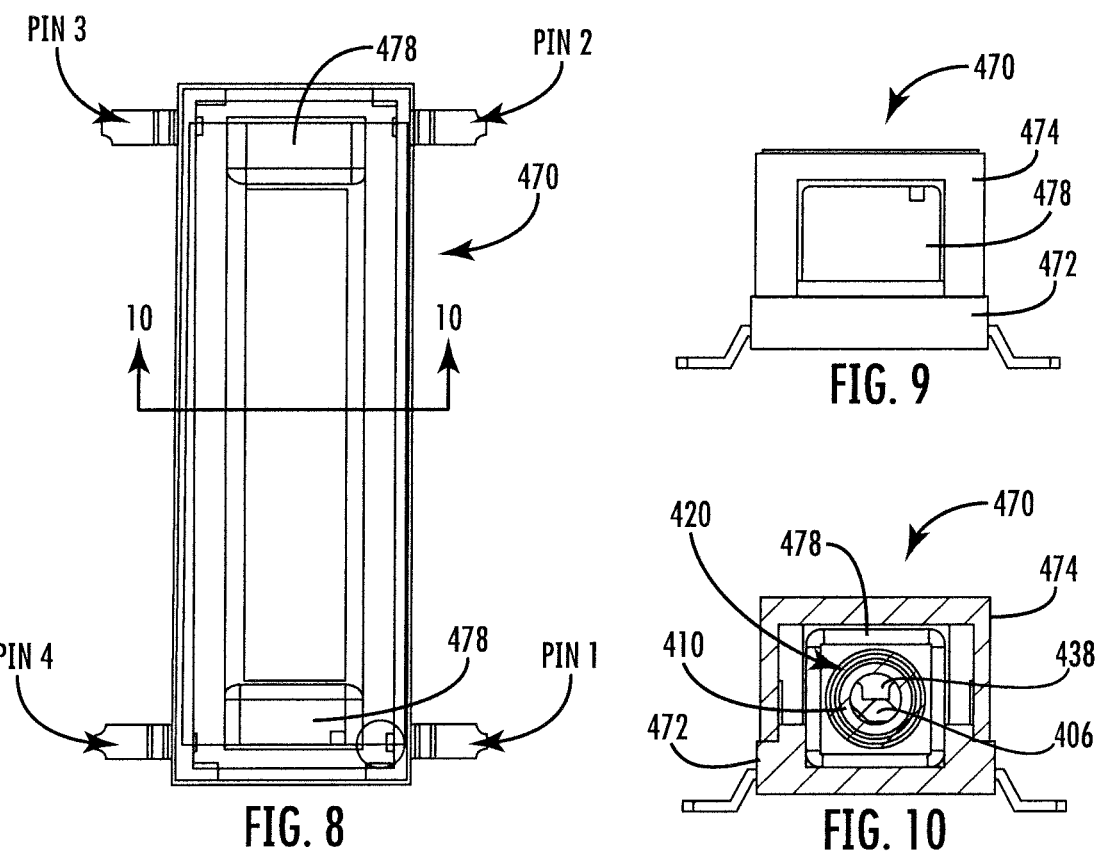

MAGNETIC FIELD MONITOR HAVING AUTOMATED QUANTITATIVE CALIBRATION OF MAGNETIC FIELD SENSOR

FIELD OF THE INVENTION

The present invention relates to magnetic field sensors, and more particularly, this invention relates to calibration of magnetic field sensors.

BACKGROUND OF THE INVENTION

The output of magnetic field sensors vary, with their output based on a variety of factors, including temperature, tolerance variances in the electronic control circuitry, and the sensor transducer orientation relative to Earth's magnetic North. This may lead to processing challenges that present themselves for many magnetic field sensors, but in particular, for multi-axis magnetic field sensors because each of the three primary axes are oriented in different positions relative to magnetic North, for example, in an X, Y and Z axis direction. As a result, the output from magnetic field sensors may be non-linear, and this type of non-linear output may be difficult to quantify. In applications where quantification is desired, advanced, complicated and expensive electronic components and circuits are often required to process the signals and attempt to force the output of one or more of the magnetic field sensors to be calibrated to a reliable Tesla (magnetic measurement) value. Some existing solutions are limited to forcing a calibration over a very small bandwidth, and only under certain conditions. Additionally, in cases where the magnetic field sensor is employed at a location where there is an excessive magnetic field, such as near rebar or other ferrous materials, the magnetic field sensors typically will not operate in a calibrated mode, since there is a bias to the output due to the environment.

SUMMARY OF THE INVENTION

This summary is provided to introduce a selection of concepts that are further described below in the Detailed Description. This summary is not intended to identify key or essential features of the claimed subject matter, nor is it intended to be used as an aid in limiting the scope of the claimed subject matter.

A magnetic field monitor for monitoring magnetic field fluctuations occurring in an environment comprises a magnetic field sensor configured to generate an electronic signal at a time period representing a magnetic field of the environment. The magnetic field sensor comprises a sensor transducer having a sensor bobbin and a primary coil wound thereon and including first and second ends, and a secondary, over-winding coil including first and second ends, a sensor circuit connected to the first end of the primary coil, a controller connected to the second end of the primary coil, and a digitally controlled potentiometer connected to the first end of the secondary coil and operatively connected to the controller.

A self-calibrating module is connected to the magnetic field sensor and comprises a calibrator connected to the magnetic field sensor and configured to generate a relative baseline signal based on an average value of electronic signals generated at previous time periods to represent the magnetic field of the environment, and a comparator connected to the calibrator and configured to determine a difference between the relative baseline signal and electronic signal and generate a calibrated output signal if the difference is greater than or equal to a threshold. When a calibrated output signal is not generated, the controller and digitally controlled potentiometer are configured to operate the sensor transducer to obtain a quantitative linear output.

The digitally controlled potentiometer may be configured to sweep a voltage from negative to positive over the secondary, over-winding coil and provide a changing voltage to the secondary, over-winding coil, wherein each different voltage produces a current that changes the output frequency of the sensor transducer. A positive and a negative low drop-out (LDO) voltage regulator may be connected to the digitally controlled potentiometer. The secondary, over-winding coil may approach zero at the midpoint of the potentiometer voltage sweep.

An electronic ground may have a tolerance resistor and connected to the second end of the secondary, over-winding coil. The controller may be configured to generate a sensor response curve and convert a non-linear output of the sensor transducer to a quantitative linear output. The controller may be configured to update a sampling rate of the magnetic field sensor.

The magnetic field sensor may comprise a multi-axis magnetic field sensor having primary axes oriented in different positions relative to magnetic North and having a non-linear output channel at each axis. The controller may comprise a counter, a signal processing circuit, a serial peripheral interface (SPI) connected to said digitally controlled potentiometer and a universal asynchronous receiver-transmitter (UART) for software control. The magnetic field monitor may include a plurality of magnetic field sensors, a calibrator connected to each of the magnetic field sensors and configured to generate the relative baseline signal based on an average value of the electronic signals from each of the magnetic field sensors. A sensor input/output controller may be connected to the self-calibrating module and have a signal combiner to combine the electronic signals from the plurality of magnetic field sensors into a single electronic signal. A sensor event assessor may be connected to the sensor input/output controller and configured to receive and process the single electronic signal to provide assessment information about a sensed event.

In yet another example, a magnetic field monitor monitors magnetic field fluctuations occurring in an environment and comprises a magnetic field sensor configured to generate an electronic signal at a time period representing a magnetic field of the environment. The magnetic field sensor may comprise a sensor transducer having a sensor bobbin, a primary coil wound on the sensor bobbin, the primary coil having first and second ends, a secondary, over-winding coil wound over the primary coil, said secondary, over-winding coil including first and second ends, and a sensor circuit connected to the first end of the primary coil, a controller connected to the second end of the primary coil, and a digitally controlled potentiometer connected to the first end of the secondary, over-winding coil and operatively connected to the controller.

A positive and a negative voltage source may be connected to the digitally controlled potentiometer. The digitally controlled potentiometer may be configured to sweep a voltage from negative to positive over the secondary, over-winding coil and provide a changing voltage to the secondary, over-winding coil. Each different voltage produces a current that changes the output frequency of the sensor transducer. The controller may be configured to generate a sensor response curve and convert a non-linear output of the sensor transducer to a quantitative linear output.

In yet another aspect, a method of monitoring magnetic field fluctuations occurring in an environment may comprise providing a magnetic field sensor that includes a sensor transducer having a sensor bobbin, a primary coil wound on the sensor bobbin, the primary coil having first and second ends, a secondary, over-winding coil wound over the primary coil, said secondary, over-winding coil including first and second ends, a sensor circuit connected to the first end of the primary coil, a controller connected to the second end of the primary coil, and a digitally controlled potentiometer connected to the first end of the secondary, over-winding coil and operatively connected to the controller. The method includes sweeping a voltage from positive to negative at the digitally controlled potentiometer and over the secondary, over-winding coil to provide a changing negative to positive voltage at the secondary, over-winding coil, wherein each different voltage produces a current that changes the output frequency of the sensor transducer to produce a non-linear output. The method further includes generating at the controller a sensor response curve and converting the non-linear output of the sensor transducer to a quantitative linear output.

DESCRIPTION OF THE DRAWINGS

Other objects, features and advantages of the present invention will become apparent from the Detailed Description of the invention which follows, when considered in light of the accompanying drawings in which:

FIG. 7 is an isometric view of the carrier that holds sensor coils and sensor bobbin.

FIG. 8 is a fragmentary top plan view of the sensor carrier showing the sensor bobbin and wound sensor coils.

FIG. 9 is an end view of the sensor carrier of FIG. 7.

FIG. 10 is a sectional view of the carrier of FIG. 8 taken along line 10-10 of FIG. 8.

DETAILED DESCRIPTION

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

The magnetic field monitor, in accordance with a non-limiting example, reliably and repeatedly allows the conversion of qualitative, uncalibrated, non-linear magnetic sensor output into quantitative Tesla calibrated linear output over a wide bandwidth range. The magnetic field monitor not only provides a rapid technique for calibration, but accounts for differences in outputs based on sensor orientation relative to magnetic North.

The magnetic field monitor will monitor magnetic field fluctuations occurring in an environment and may be incorporated within a self-calibrating module such as described in commonly assigned U.S. Pat. No. 10,165,228, the disclosure which is hereby incorporated by reference in its entirety. For example, when a calibrated output signal is not generated using the system as described in the '228 patent, the magnetic field monitor may be configured operate the sensor transducer to obtain a quantitative linear output.

Figure 1:
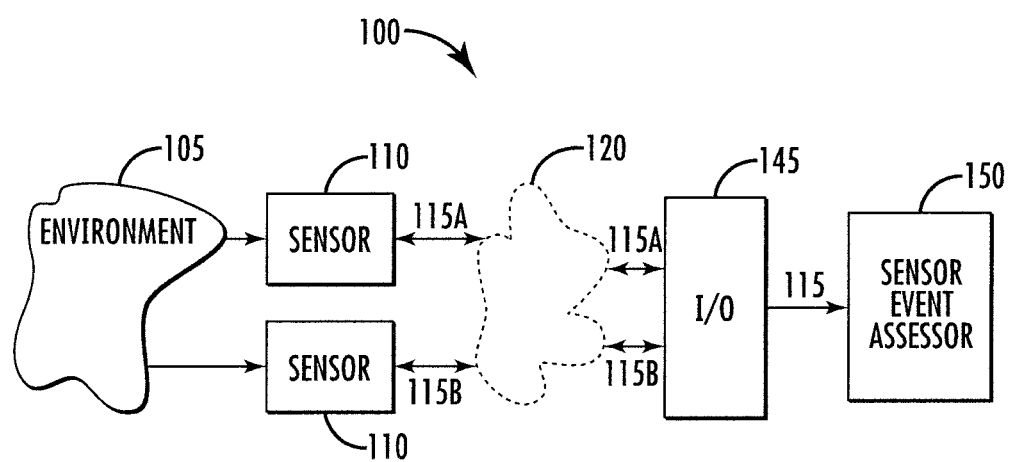
FIG. 1 is a block diagram of a conventional magnetic field sensing system.
Figure 2:
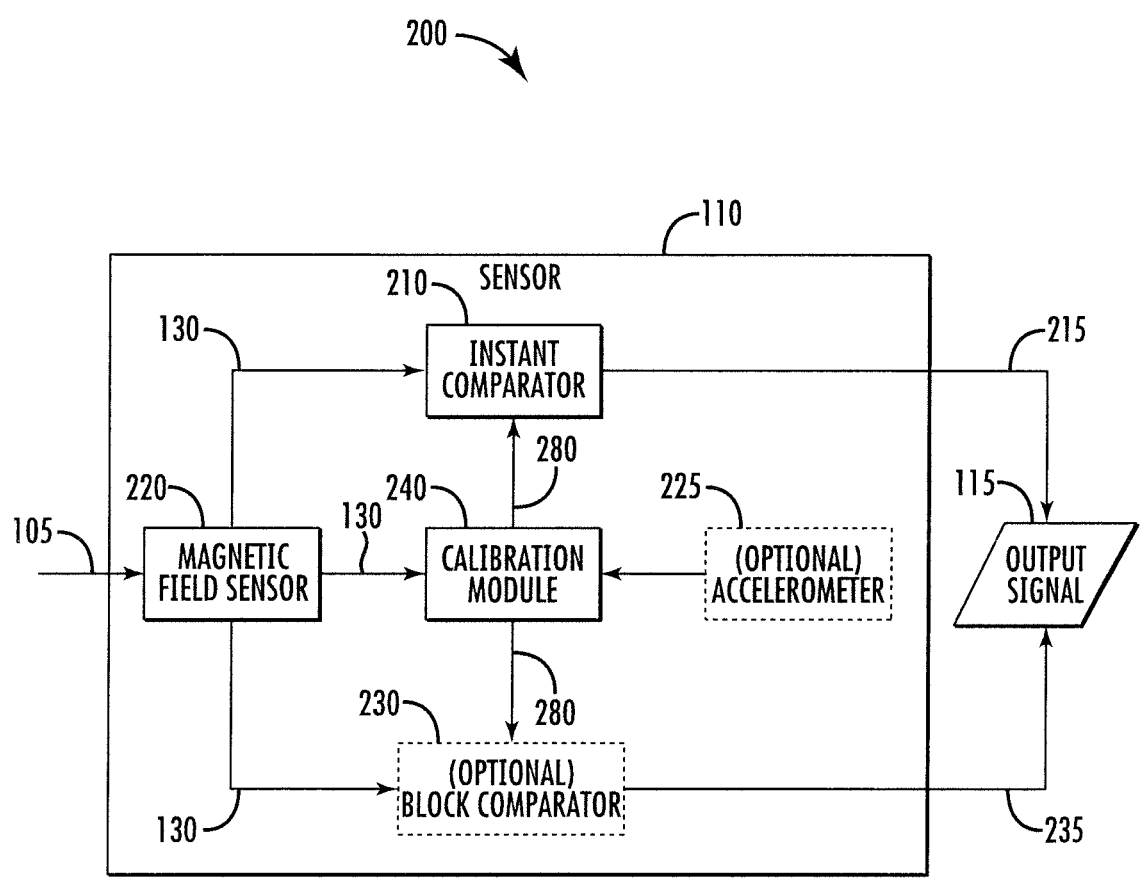
FIG. 2 is a block diagram of a magnetic field sensor used in the magnetic field sensing system of FIG. 1.
Figure 3:
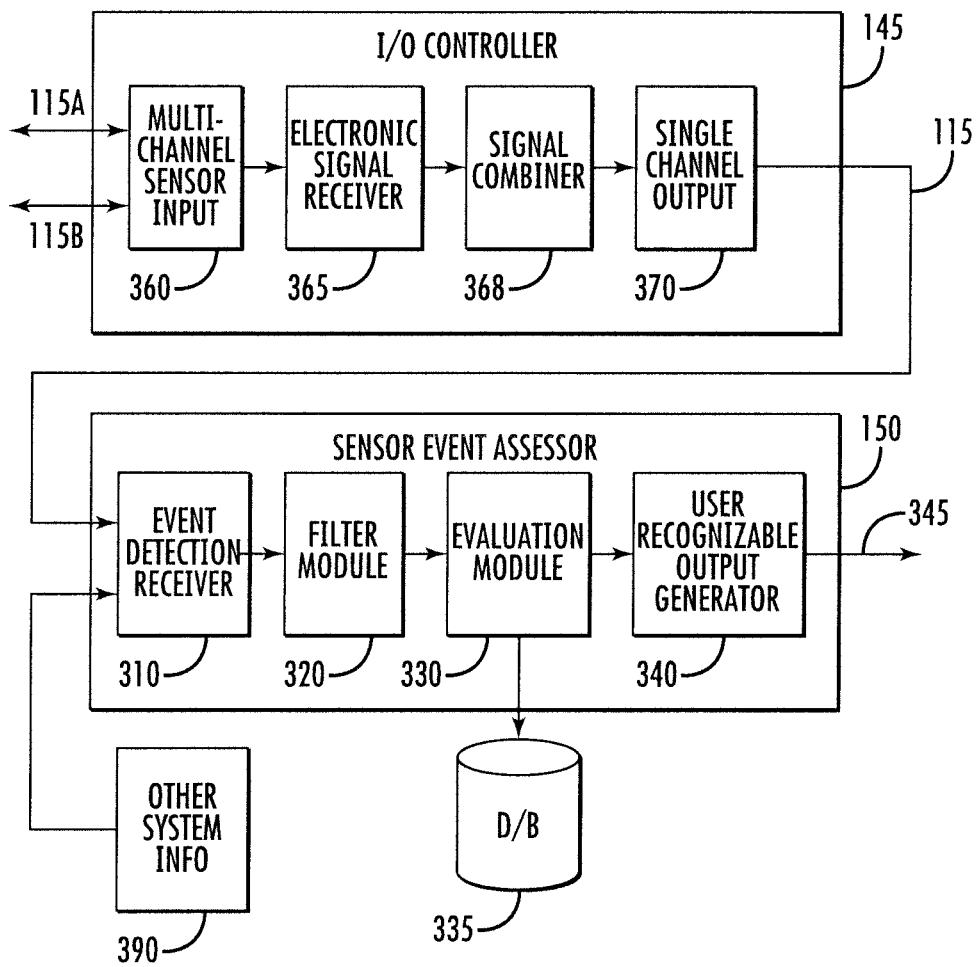
FIG. 3 is a block diagram of the input/output controller and sensor event assessor shown in FIG. 1.

For purposes of explanation, a short description of the sensor event assessor training and integration as described in '228 patent is set forth relative to FIGS. 1-3 and further reference should be made to the description in the '228 patent to understand fully the workings and operation of that system. The present magnetic field monitor may be used with that dynamically self-adjusting system as described in the '228 patent and commonly assigned U.S. Pat. Nos. 9,354,291 and 10,107,872, the disclosures which are hereby incorporated by reference in their entirety.

With reference to FIG. 1, a block diagram 100 of a sensor event assessor system as described in the incorporated by reference '228 patent is shown. As illustrated, FIG. 1 includes an environment 105, at least two magnetic field sensors 110 which provide output signals 115A and 115B over the connection 120. Output signals 115A, 115B are received by input/output (I/O) controller 145, which receives the multi-channel output signals 115A and 115B and combines them into a single channel 115 that is passed to sensor event assessor 150. Although two output signals 115A and 115B are shown, the technology is not limited to only two sensors, but a large plurality of sensors may be used. In this example and relative to the description, the sensors 110 are magnetic field sensors.

In general, the environment 105 may be natural or built and is usually described using a combination of atmosphere, climate and weather conditions. Example, environments may include, but are not limited to, desert, tundra, canopy, jungle, riverine, aquatic, littoral, savannah, marine, urban or the like.

In one embodiment, the environment 105 is a localized area or portion of an environment, similar to an ecosystem.

For example, in one embodiment the area represented by environment 105 may approximate the range of operation of magnetic field sensors 110.

In one embodiment, environment 105 may be an outdoor area. However, in another embodiment, environment 105 may be an indoor area such as a room, a structure or the like. In yet another embodiment, environment 105 may be a combination of indoor and outdoor areas such as an outpost, or the like. Additionally, part or all of environment 105 may be dry, partially or completely submerged, partially or completely buried, and the like. Further details are described in the incorporated by reference '228 patent.

With reference now to FIG. 2, a block diagram 200 of one of the at least two magnetic field sensors 110 as a magnetic field monitor, in this example, is shown in accordance with one embodiment. The magnetic field sensor 110 may include magnetic field sensor 220, calibration module 240, and instant comparator 210. The magnetic field monitor also includes an optional block comparator 230 and accelerometer 225. Magnetic field sensor 220 may be a flux gate magnetometer sensor, a super conducting quantitative interference detector (SQUID), a magneto resistive sensor, spin electron relaxation frame (SERF) sensor or the like.

Magnetic field sensor 220 may sample environment 105 periodically at a pre-defined rate of time and generates a corresponding signal 130 for each sampling period. For example, the magnetic field sensor 220 may use a 1 MHz crystal to establish a nanosecond sample rate. The magnetic field sensor 220 outputs a signal 130 to instant comparator 210, calibration module 240 and optional block comparator 230.

The calibration module 240 may receive an output signal 130 from magnetic field sensor 220 and generate a relative baseline signal 280. For example, after the calibration module 240 receives an initial time periods worth of signals 130, the calibration module 240 may average the signals 130 and generate a relative baseline signal 280. In other words, the relative baseline signal 280 is similar to a calibration, recalibration, zero or baseline for the particular environment 105 being monitored. In one example, the relative baseline signal 280 may be a relative value and not an explicit magnetic field strength value.

The instant comparator 210 may perform a comparison between the signal 130 and relative baseline signal 280 to recognize a change in environment 105. When the resultant difference between the magnetic field of the environment 105 and relative baseline signal 280 is greater than or equal to a pre-defined difference threshold, the instant comparator 210 provides an output signal 115.

The instant comparator 210 in an example may not use an actual magnetic field strength value as the threshold value, but may instead use a threshold value related to the difference between the signal 130 and the relative baseline signal 280. Thus, in an example, neither the signal 130 nor the relative baseline signal 280 need include a specific or quantified value for magnetic field 110 as long as the magnetic field sensor 220 provides a consistent representation of the magnetic field 110 in the signal 130. However, in another embodiment, the signal 130 and/or relative baseline signal 280 may include a specified value related to the magnetic field 110.

For example, the threshold value may be based on the absolute value of the difference between the signal 130 and the relative baseline signal 280. By using the absolute value of the difference, the instant comparator 210 is well suited to recognizing changes in magnetic field 110 that increase the field strength as well as changes in magnetic field 110 that reduce the field strength.

The optional block comparator 230 may operate in a manner similar to the instant comparator 210, but may be calibrated to recognize changes in the magnetic field 110 over a greater time period than the instant comparator 210. When the change over time for the relative baseline signal 280 is greater than or equal to a pre-defined threshold, the block comparator 230 may provide an output signal 115. Further details of operation are described in the incorporated by reference '228 patent.

The optional accelerometer 225 may be used to provide motion and orientation information to the sensors 110. For example, if one or more of the sensors 110 were hanging from a tree, rolled across the ground, bumped, rotated, moved or the like, the accelerometer 225 may provide orientation and motion information that would allow sensors 110 to maintain its calibration. Further details of operation are described in the incorporated by reference '228 patent.

With reference now to FIG. 3, a block diagram of an I/O controller 145 and a sensor event assessor 150 is shown in accordance with an example. Although in this example, the I/O controller 145 is shown as distinct from the sensor event assessor 150, and in another example, the I/O controller 145 may be located within a sensor event assessor 150.

In an example, the I/O controller 145 includes a multi-channel sensor input 360, an electronic signal receiver 365, a signal combiner 368 and a single channel output 370. In yet another example, the multi-channel sensor input 360 provides two-way communication with the plurality of sensors 110, each of the plurality of sensors 110 having its own channel, such as 115A and 115B. The electronic signal receiver 365 may receive electronic signals from one or more of the plurality of sensors 110 at a pre-defined sample rate. The signal combiner 368 may bundle the electronic signals from one or more of the plurality of sensors 110 into a single electronic signal 115. The single channel output 370 may provide the single electronic signal 115 to the sensor event assessor 150.

For example, the I/O controller 145 may receive the multi-channel output signals 115A and 115B and combines them into a single channel 115 that is passed to sensor event assessor 150. Moreover, the I/O controller 145 can also communicate with each of the sensors 110. For example, the I/O controller 145 is capable of adjusting the sample rate of one or more of the sensors 110. In addition, the I/O controller 145 may adjust the power consumption of one or more sensors 110. The I/O controller may additionally monitor, organize, cascade, utilize and otherwise interact with each of the sensors 110.

In yet another example, the I/O controller 145 may also automatically adjust the baseline settings of one or more of the sensors 110 in the network based on one or more other sensors 110. For example, if a rogue sensor is providing an output signal that is outside of the normal (with respect to other sensors 110 in the network), I/O controller 145 may provide a calibration update to the rogue sensor to the appropriate baseline. In so doing, a network wide baseline or calibration can be automatically achieved.

In yet another example, the sensor event assessor 150 may receive the output signal 115 from the I/O controller 145 and provide assessment information 345 in a user accessible format. The sensor event assessor 150 may include an event detection receiver 310, a filter module 320, an evaluation module 330 and a user recognizable output generator 340. Event detection receiver 310 receives an electronic output signal 115 related to an event detected by sensors 110 as described in detail in FIGS. 1 and 2.

The filter module 320 may compare the electronic output signal 115 with a predetermined event detection threshold. In other words, the electronic output signal 115 is passed through filter module 320 if the electronic output signal 115 is greater than or equal to the predetermined event detection threshold. The evaluation module 330 may receive the electronic signal from the filter module 320 and provide assessment information about the event. The assessment information may be based on previously trained information stored in a database 335. User recognizable output generator 340 provides the assessment information 345 about the event in a user recognizable format. Further details are described in the '228 patent. Other system information 390 may be accessed and a database 335 store data as described in the '228 patent.

Figure 4A:
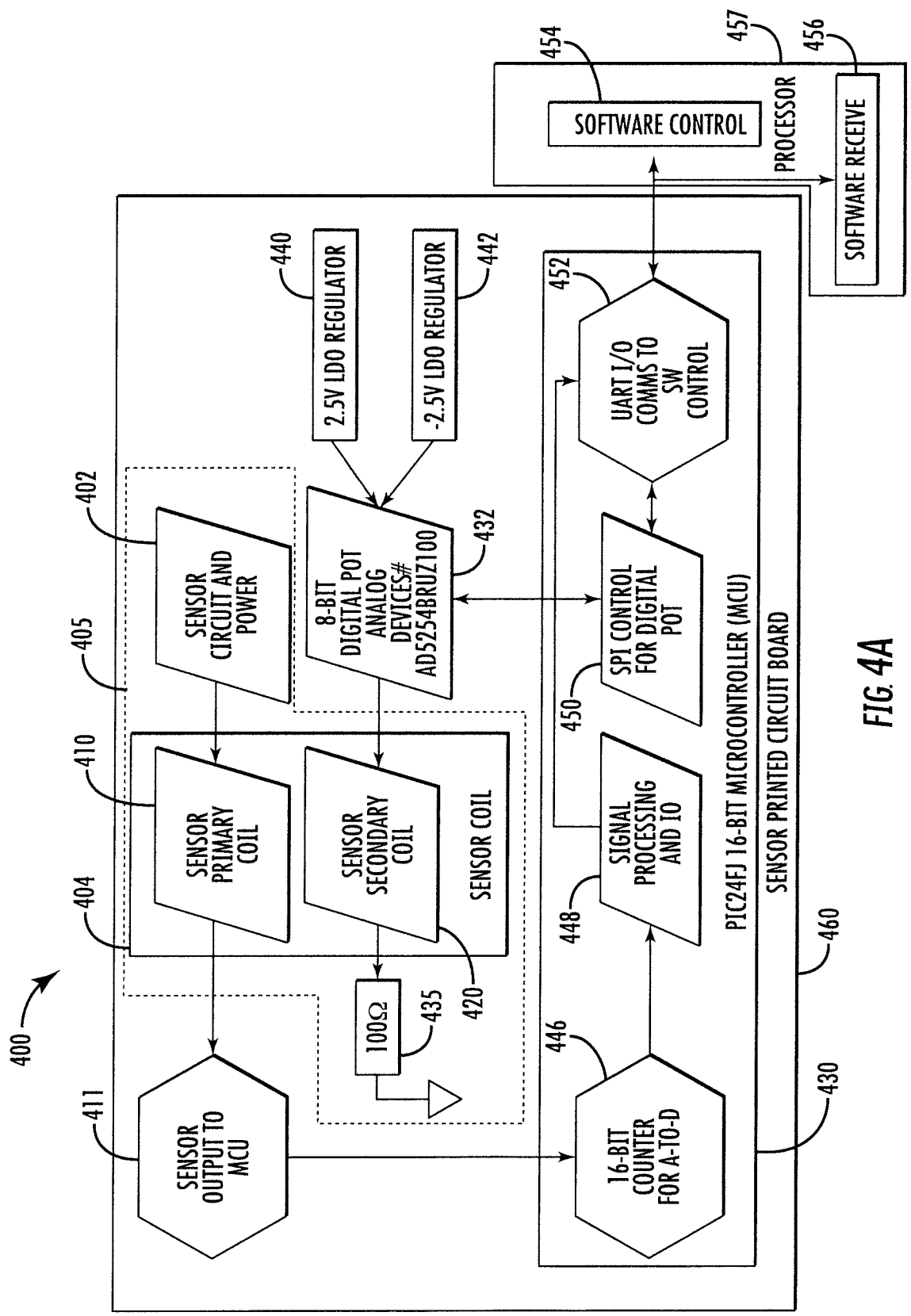
FIG. 4A is a block diagram of the magnetic field monitor in accordance with a non-limiting example.
Figure 5:
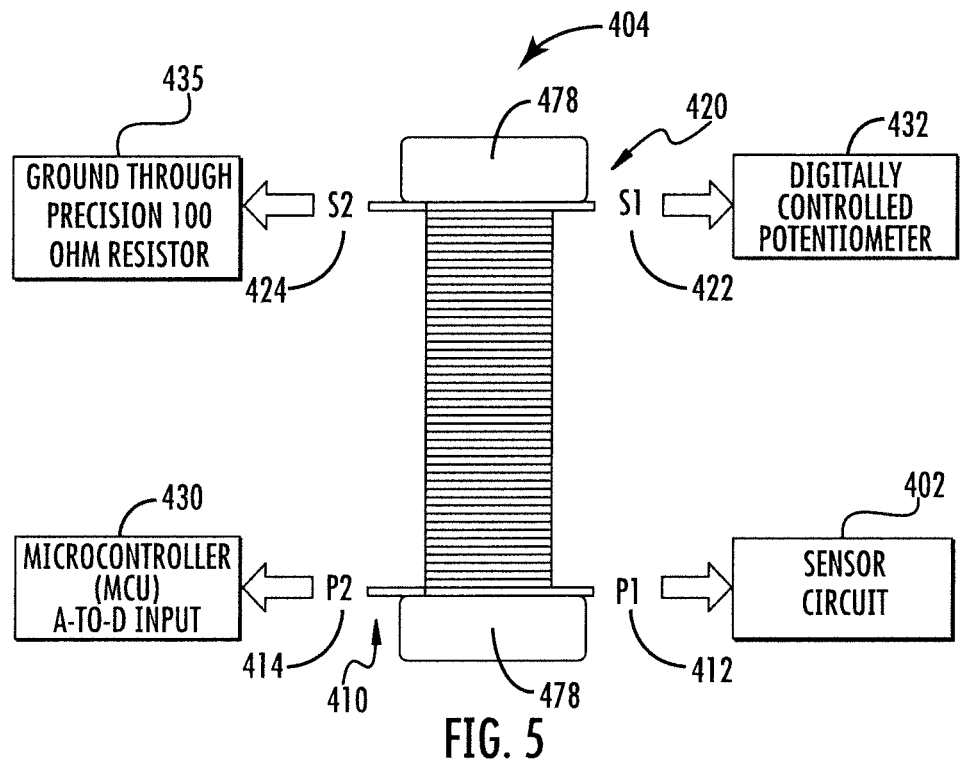
FIG. 5 is a fragmentary block diagram showing components connected to the primary coil and secondary, over-winding coil wound on the sensor bobbin in the magnetic field monitor of FIG. 4A.
Figure 6:
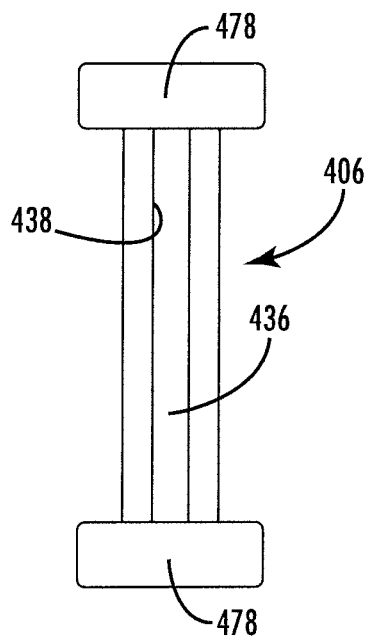
FIG. 6 is a top plan view of the sensor bobbin of FIG. 5 without wound coils thereon.

Referring now to FIG. 4A, there is illustrated a block diagram of the magnetic field monitor 400 that has the automated quantitative calibration and includes the major components of the magnetic field sensor circuit 402 that includes a power supply in this example, and is configured to generate an electronic signal at a time period representing a magnetic field of the environment. This magnetic field sensor 400 includes the sensor circuit 402 and a sensor coil 404, also termed a sensor transducer or sensor transducer assembly, that includes a sensor bobbin 406 (FIG. 6). As better shown in FIGS. 5 and 6, a primary coil 410 is wound on the sensor bobbin 406 as an inner coil and includes first and second ends 412, 414 and a secondary, over-winding coil 420 is wound on the sensor bobbin 406 as an outer coil and includes first and second ends 422, 424. The sensor coil 404, or sensor transducer and sensor circuit 402, form a magnetic field sensor 405 that is outlined by the dashed lines in FIG. 4A, although one or all components could form the magnetic field sensor, such as the potentiometer and other components described below. The sensor circuit 402 is connected to the first end 412 of the primary coil 410 and a controller 430 as a microcontroller (MCU) with an analog-to-digital input as an example is connected to the second end 414 of the primary coil. A digitally controlled potentiometer 432 is connected to the first end 422 of the secondary, over-winding coil 420 and operatively connected to the controller 430 as shown in FIG. 4A. The second end 424 of the secondary, over-winding coil 420 is connected to ground 435 via a precision 100 ohm resistor.

In an example, a self-calibrating module 240 and other components, such as described relative to FIG. 2, may be connected to the magnetic field monitor 400 and may calibrate as described with the circuits of FIGS. 1-3. The calibration module 240 may be configured to generate a relative baseline signal based on an average value of the electronic signals generated at previous time periods to represent the magnetic field of the environment. The comparator 210 may calibrate and may be configured to determine a difference between the relative baseline signal and electronic signal and generate a calibrated output signal if the difference is greater than or equal to the threshold. When a calibrated output signal is not generated, the controller 430 and digitally controlled potentiometer 432 may be configured to operate the sensor transducer 404 and other components to obtain a quantitative linear output.

The controller 430 may be configured to generate a sensor response curve as described later and convert a non-linear output of the sensor transducer or sensor coil 404 to a quantitative linear output. A plurality of the magnetic field sensors 405 may be used and a calibrator 240 connected to each of the magnetic field sensors and configured to generate the relative baseline signal based on the average value of the electronic signals from each of the magnetic field sensors. In an example, the sensor input/output controller 145 (FIG. 3) may be connected at the calibration module 240 and output signal 115 and have a signal combiner to combine the electronic signals from the plurality of magnetic field sensors into a single electronic signal. The sensor event assessor 150 may be connected to the sensor input/output controller 145 and configured to receive and process the single electronic signal to provide assessment information about a sensed event.

The sensor bobbin 406 (FIG. 6), as will be described in greater detail below, includes a metglas core 436 that is received within a trough 438 of the sensor bobbin. In an example, the digitally controlled potentiometer 432 is an 8-bit digitally controlled potentiometer, for example, an analog device number AD5254BUZ100, and is configured to sweep a voltage from negative to positive over the secondary, over-winding coil 420 and provide a changing voltage to the secondary, over-winding coil. Each different voltage produces a current that changes the output frequency of the sensor transducer assembly, or sensor coil 404. In an example as shown in FIG. 4A, a positive low-dropout (LDO) voltage regulator 440 of about 2.5 volts may be connected to the digitally controlled potentiometer 432 and a −2.5 volts LDO voltage regulator 442 may be connected to the digitally controlled potentiometer 432 to provide a sweep of voltage from −2.5 volts to +2.5 volts.

As shown in FIG. 4A, the controller 430 may include a counter 446, a signal processing and input/output circuit 448, a serial peripheral interface (SPI) 450 connected to the digitally controlled potentiometer 432, and a universal asynchronous receiver-transmitter (UART) communications controller 452 that interoperates with software control 454 that may include external software receive 456, which may be included and processed via a processor 457, which could be part of the controller 430 or separate. In an example, the counter may be a 16-bit counter for analog-to-digital conversion, where the sensor output 411 is received from the sensor primary coil 410 and passed into the 16-bit counter. The SPI controller 450 may help control operation of the digitally controlled potentiometer 432. In an example, the controller 430 could be a PIC24FJ 16-bit microcontroller. The different components may be positioned on a sensor printed circuit board (PCB) 460 as a non-limiting example.

As will be explained in greater detail below, the voltage to the secondary, over-winding coil 420 approaches zero at the midpoint of the digitally controlled potentiometer 432 voltage sweep. The electronic ground 435 includes a tolerance resistor, which in this example is a 100 ohm resistor, and is connected to the second end 424 of the secondary, over-winding coil 420 (FIG. 5). The controller 430 may be configured to update a sampling rate of the magnetic field sensor 405, and in a preferred example, the magnetic field sensor comprises a multi-axis magnetic field sensor having primary axes oriented in different positions relative to magnetic North and having a non-linear output channel at each axis, which in an example, are three channels for the X, Y and Z-axes.

Referring again to FIG. 4A, the magnetic field sensor output 411 is a frequency, in kilohertz, and received at the controller 430. A known voltage moves through a known number of turns in the secondary, over-winding coil 420 through a specific resistance and allows a known magnetic field referring to the Bio-Savart Law as explained below. At any given setting of the digitally controlled potentiometer 432, the known magnetic field is able to be calculated. The digitally controlled potentiometer 432 is controlled by the controller 430 and the potentiometer in one example will provide a varying voltage in a linear fashion for each setting, from one supply of voltage at the "zero" setting, and the second supply voltage at the number 255 setting. The software, such as part of the controller or separate processor 457 for the monitor 400, controls the controller 430 to start a setting zero, and the software logs the magnetic field.

The controller 430 receives the frequency output and communicates the value to the software, which logs this value of the magnetic field as a function of frequency. The controller 430 (or other device) may include a database memory for storing such values. This process may be repeated 255 more times for each potentiometer 432 setting to provide a relationship of the magnetic field to the frequency. The software as part of the program and the controller 430 or other processor calculates the change in frequency per potentiometer setting to find the gain as a change per unit. The maximum gain is chosen by the software and communicates to the controller 430 to set the digitally controlled potentiometer 432 to that value with the highest gain to operate in a "sweet spot," as will be explained in greater detail in an example below. The software chooses 20 positions (ten higher and ten lower) of potentiometer settings and uses the frequency response and the known values of the magnetic fields at those settings to calculate a response curve. This response curve may be a six order polynomial fit over the 21 (the 10 lower, the center point, and the 10 higher) potentiometer settings. When a calibration loop is complete, the polynomial fit acts as a transfer function to calculate the magnetic field in real time by converting change in frequency to change in magnetic field. Post-calibration, the controller 430 outputs the measured frequency sensor value and the software converts it to a calibrated magnetic field value.

Figure 4B:
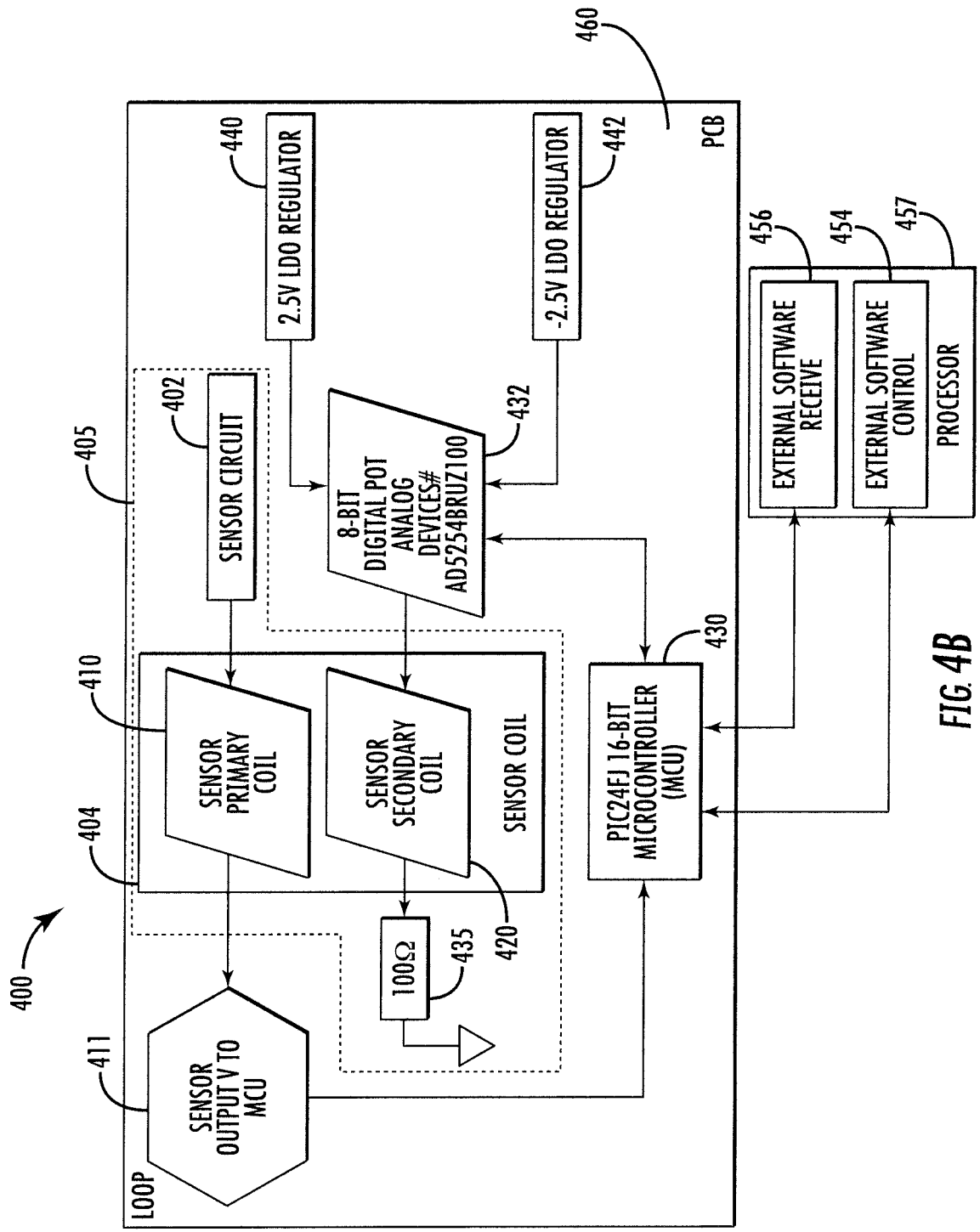
FIG. 4B is a block diagram similar to that of FIG. 4A and showing a flow sequence in operation of the magnetic field monitor.

FIG. 4B illustrates an auto calibration flow sequence in a calibration loop, where the magnetic field sensor output is a frequency as described above and the software operating with the controller 430 directs the controller 430 to set a potentiometer 432 value to a value "zero." The magnetic field sensor output for a sample is "0a" and the microcontroller outputs 0a to the software and receives five samples: 0a, 0b, 0c, 0d, and 0e. The software average is the five samples and logs the sample 0ave as the zero average. This process is looped 250 more times for the potentiometer setting 1, 2, 3 . . . 255. Logged values from the 0ave to the average of the 255 settings (255ave) are fit to the 6th order polynomial equation and the delta frequency per potentiometer change is calculated to find the maximum response (gain) of the sensor coil 404. The software instructs the controller 430 to set the digitally controlled potentiometer 432 to a value with the maximum gain, which is also known as the "sweet spot." The values for each discrete value that are 10 values above and 10 values of the potentiometer setting below the sweet spot are established and the 21 potentiometer setting values are used to fit with the 6th order polynomial function. This polynomial fit becomes a translation function and the software operating the controller 430 uses this function to calculate the real-time magnetic values over the 21 potentiometer ranges, also known as the bandwidth.

Figure 11:
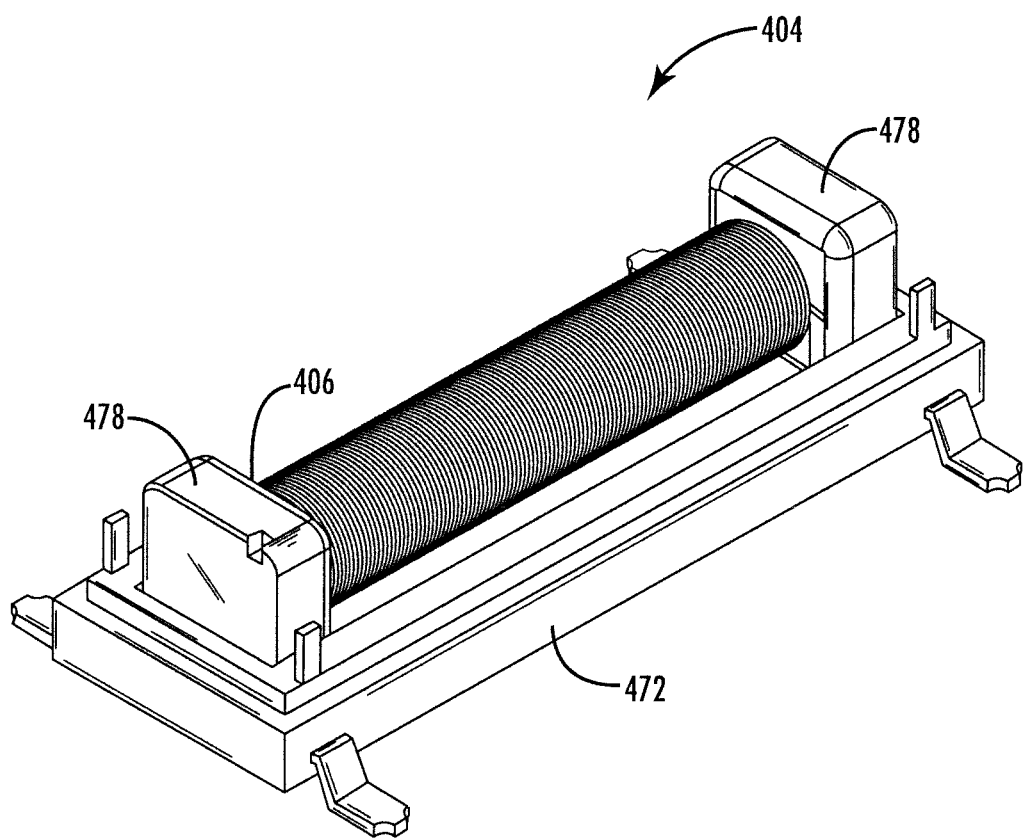
FIG. 11 is an isometric view of the sensor bobbin and wound sensor coils received on the carrier support.

Referring now to FIGS. 7-11, there is illustrated generally a carrier 470 for the sensor bobbin 406 and the sensor coils 410, 420, which are received over the sensor bobbin and its core 436 received in the trough 438 (FIG. 6). The sensor coils 410, 420 are constructed using known coil wire and bonding, for example, NEMA MW 29-C with 36 PN bond, and the wound sensor bobbin 406 is received on a lower carrier support 472 that receives a carrier housing cover 474 and top plate 476. The end view (FIG. 9) shows the head or end 478 of the sensor bobbin 406 (known as the bobbin head 478) and the sectional view (FIG. 10) shows the sensor bobbin 406, core 438 as a core ribbon, and sensor coils as the primary coil 410 and secondary over-winding coil 420. As shown in FIG. 8, the carrier support 472 includes four pins labeled PIN 1 to PIN4 for connecting to the printed circuit board 460. In a non-limiting example, the carrier 470 may be about 20 millimeters in length (20.320 in one example) and about 5.7 by about 6.6 millimeters in cross-section. The sensor bobbin 406 with the primary coil 410 and secondary over-winding coil 420 wound thereon is received in the bottom surface of the carrier support 472. The carrier support 472 includes the four pins that are numbered PIN1 to PIN4 and have the respective ends of the coils 410, 420 connected thereto. An example completed sensor bobbin 406 with wound coils 410, 420 and received on the carrier support 472 is shown in FIG. 11 with the bobbin heads 478 secured in the carrier support 472.

Figure 12:
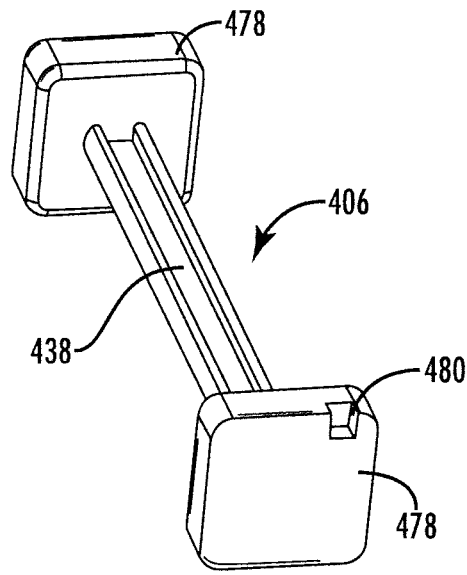
FIG. 12 is an isometric view of the sensor bobbin.

Referring now to FIG. 12, there is illustrated the sensor bobbin 406, which includes the enlarged rectangular configured ends as the bobbin heads 478. The sensor bobbin 406 may be about 18 millimeters long and includes the trough 438 formed within the central portion and is about 15 millimeters long in this example. The trough 438 may be about 0.5 millimeters, and in an example, about 0.476 millimeters in depth by about 0.8 millimeters, and in an example, 0.78 millimeters in width. These dimensions can vary. The core 436 is received within the trough 438 of the sensor bobbin 406, such as by Loctite 401 adhesive as a non-limiting example. For example, about 0.001 milliliter of Loctite 401 adhesive may be applied in the trough 438 and the core 436 inserted. The core 436 may be ribbon configured, in an example, and is inserted into the trough 438 with the adhesive and is pressed down for about 20 seconds to allow the Loctite 401 to cure for one minute.

Figure 13:
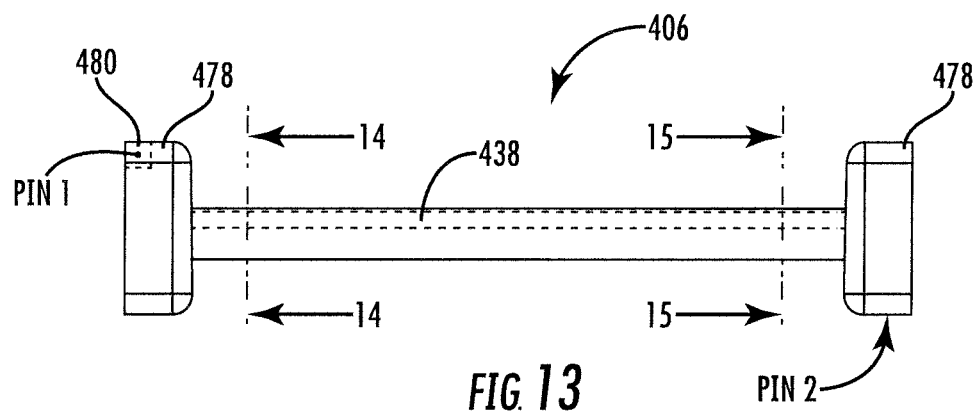
FIG. 13 is a front elevation view of the sensor bobbin.
Figure 14:
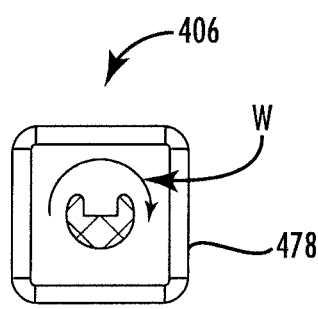
FIG. 14 is a sectional view of the sensor bobbin taken along line 14-14 of FIG. 13 showing the winding direction of the primary coil.
Figure 15:
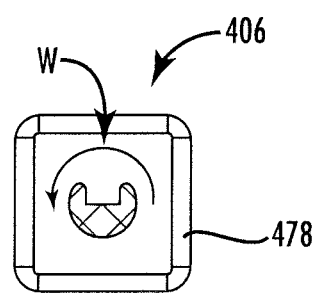
FIG. 15 is a sectional view of the sensor bobbin along line 15-15 of FIG. 13 showing the winding direction of the secondary, over-winding coil.

Referring now to FIGS. 13-15, there are illustrated the front elevation view (FIG. 13) of the sensor bobbin 406, also termed coil forming bobbin, and in FIG. 14, the sectional view taken along line 14-14 of FIG. 13 and showing the winding direction (W) for the primary coil 410 and in FIG. 15, the sectional view along line 15-15 of FIG. 13 showing the winding direction (W) for the secondary, over-winding coil 420. The primary coil 410 is the first coil that is wound. The process for winding starts with a coil wire such as NEMA MW 29-C 36 PN bond to pin number 1 toward the end of the inner face of the bobbin head 478 at the square notch 480 (FIG. 12). The primary coil 410 is wound clockwise from PIN1 in the direction of the arrow onto the coil forming sensor bobbin 406, starting in contact with the inner face of the bobbin head 478. In an example, four layers of 97 to about 100 turns per layer are accomplished with each layer to be within about one turn of the first layer, ending at PIN4, which is the same end as PIN1. The layer of turns is adjusted to fit between the ends. The bond point and four layers are shown in the primary coil 410 of FIG. 16, showing the end of the coil with the stepped configuration, corresponding to the four layers.

For the secondary, over-winding coil 420, the coil wire is also made from NEMA MW 29-C 36 PN and the end wire is bonded to start the winding onto PIN2 at the end near the inner face of the bobbin head 478 and it is wound counter-clockwise from PIN2 and in the direction of the arrow as shown in FIG. 15 onto the sensor bobbin 406 and in contact with the inner face of the bobbin head and with the primary coil 410. Two layers of 97 to about 100 turns per layer may be wound with each layer to be within one turn of the first layer ending at PIN3, which is the same end as PIN2, and the layer turns are adjusted to fit between the ends. An example of the two layers is shown in the secondary coil of FIG. 16 showing the stepped configuration.

Figure 16:
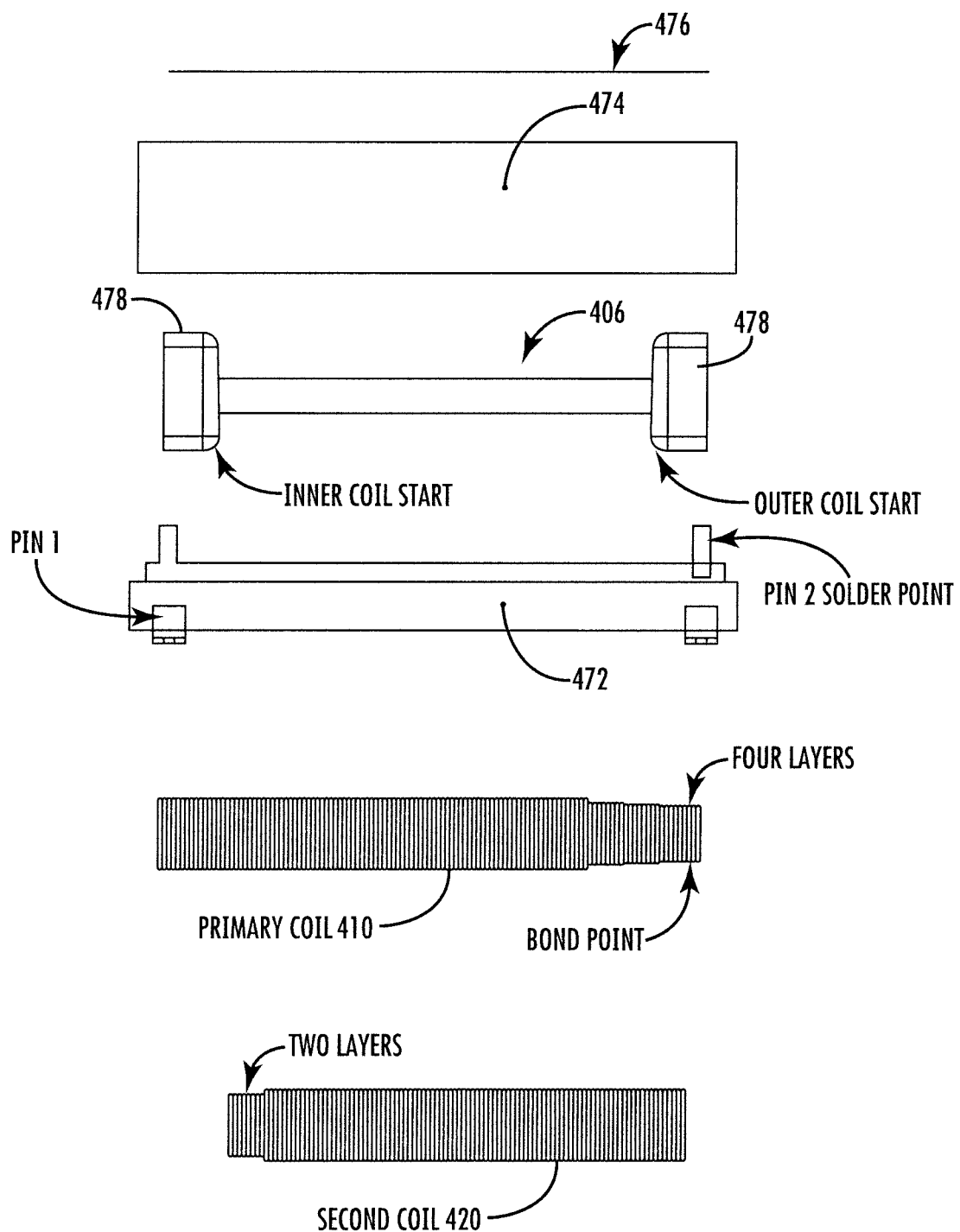
FIG. 16 is an exploded view of components from the sensor transducer, including the carrier components, sensor bobbin, primary coil, and secondary, over-winding coil.

Once the sensor bobbin 406 is wound, it is set within the carrier support 472 (FIG. 11) and as shown in the exploded view of FIG. 16, which shows the carrier support, the upper carrier housing cover 474, and the top plate 476 and the primary coil 410 and secondary over-winding coil 420. The sensor bobbin 406 is set within the carrier support 472 and the inner, or primary coil 410 is soldered starting at its wire to PIN1 and ending the other wire at PIN4. The secondary, over-winding coil 420 as the outer coil is soldered starting with the winding at PIN2 and end with the wiring at PIN3. It is possible to glue the coil forming or sensor bobbin 406 with PIN1 marked upward from the carrier support 472 into the center of the carrier with adhesive such as RTV734. The edges of the carrier housing cover 474 are glued to the carrier support 472 with adhesive and the serial number label or top plate 476 is applied to the center of the top or carrier housing cover 474.

The inner or primary coil 410 has about four layers of 97 to about 100 turns per layer, with each layer within about one turn of the first layer. The secondary, over-winding coil 420 as the outer coil has about two layers of 97 to about 100 turns per layer with each layer within one turn of the first layer. The final assembly as shown in the carrier 470 of FIG. 7 may be soldered onto the printed circuit board 460 with other components as part of the magnetic field monitor 400. It is possible for the magnetic field monitor 400 to be supported by a drone or other support structure on a drone.

A non-limiting example of the magnetic field monitor 400 uses a 400 turn secondary, over-winding coil 420 placed over the sensor bobbin 406, also termed the transducer bobbin. However, it should be understood that a different number of turns may be used for the secondary, over-winding coil 420. One end of the secondary, over-winding coil 420 may be attached to the electronic ground 435 through the precision 100 ohm, 0.1% tolerance resistor. In this example, the second end 424 of the secondary, over-winding coil 420 is attached to this ground resistor 435 (FIG. 5). The first end 422 of the secondary, over-winding coil 420 is attached to a digitally controlled potentiometer 432, which is connected to both the positive 2.5 volt and a negative 2.5 volt power source, which in this example, are the respective LDO regulators 440, 442. The actual power sources 440, 442, both positive and negative, may have other higher or lower voltage values if additional bandwidth is required. The digitally controlled potentiometer 432 in an example is 8-bit potentiometer, although the magnetic field monitor 400 could be used with a 10, 12, 24- or any other resolution source. The 8-bit potentiometer 432 has 256 different resistances, and as implemented, may be scanned, swept or locked into any one of the resistance settings, from values 0 to 255. The digitally controlled potentiometer 432 interfaces with the firmware-based controller 430 using an I2C interface. As is known, the I2C interface is a synchronous, multi-master, multi-slave, packet switched, single-ended serial computer interface. The software control initiates a sweep of the voltage sources from the negative 2.5 volts at potentiometer setting zero (C0') and as noted by ohms law (voltage=current×resistance), provides a slowly changing voltage supply to the secondary, over-winding coil 420, approaching 0 (zero) volts at the midpoint of the potentiometer sweep (position 128 on the 8-bit potentiometer) and continues up to the positive 2.5 volts (position 255 on the 8-bit potentiometer).

Figure 17:
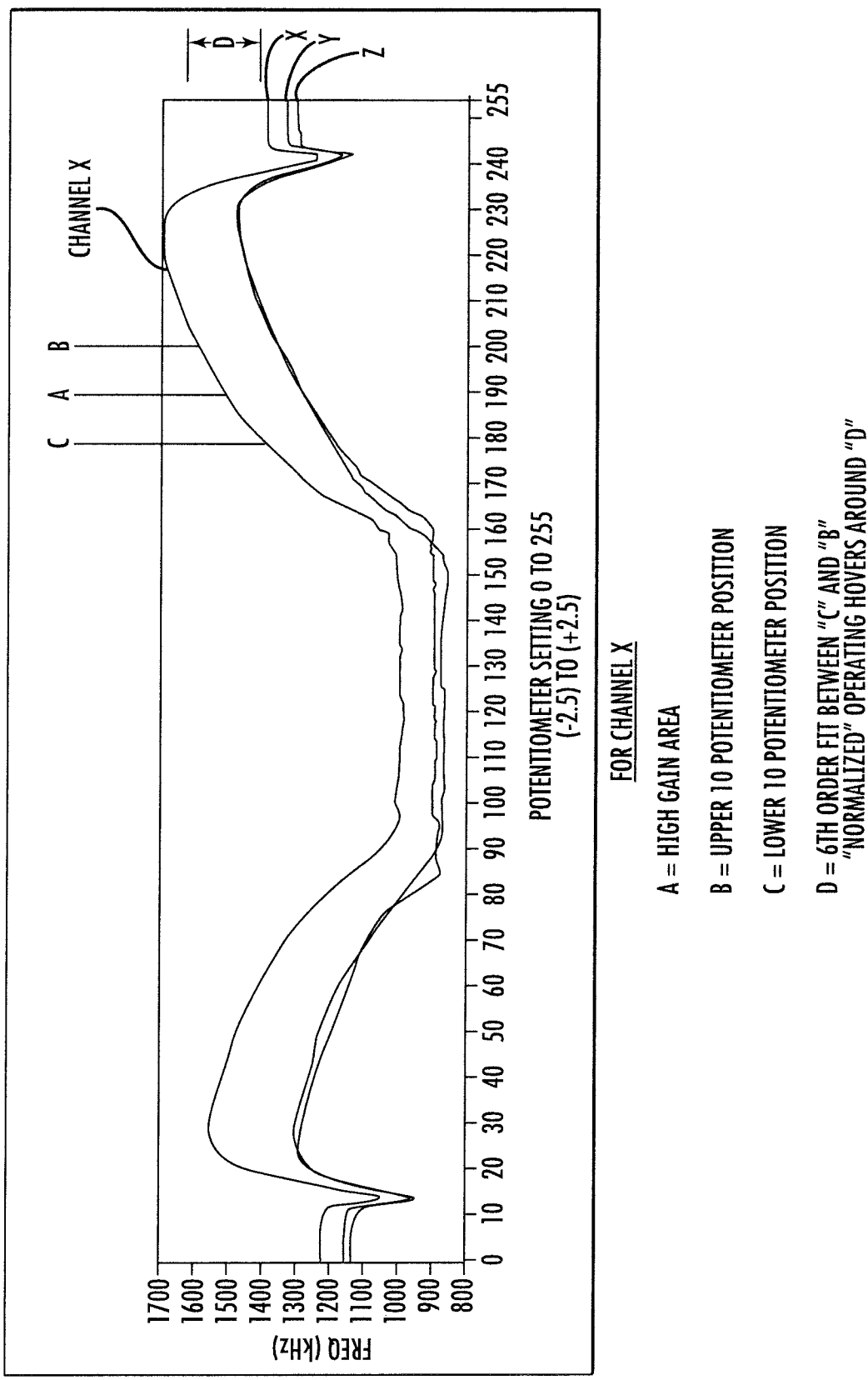
FIG. 17 is a graph showing the frequency response curve of potentiometer settings from "0" as −2.5 volts to setting 255 at +2.5 volts.

Each different voltage that is provided to the secondary, over-winding coil 420 produces a current (Ampere's Law), which changes the output frequency of the sensor transducer 404, i.e., the sensor coils. The values of the non-linear frequency response of the scan/sweep for all 256 supplied voltages (0.0195 volts per setting on the 8-bit potentiometer, i.e., 5 volts divided by 256, is recorded by the software within a memory to obtain a sensor response curve, as shown in the example graph of FIG. 17, which shows frequency response curve of a sweep from potentiometer setting "0" (negative 2.5 volts) to setting 255 (positive 2.5 volts). The lines numbered X, Y, and Z represent the three channels for the X, Y and Z-axes. Each recorded potentiometer setting response is an average of five samples taken at 10 kHz (100 ms) sample rate. The sample rate may be slower or faster and the process will be the same. As an example for Channel X in FIG. 17, on the upward section of the curve, A is the midpoint and high gain area, B is the upper 10th potentiometer setting position and C is the lower 10th potentiometer setting, with D as the vertical height corresponding to the 6th order fit between C and B where "normalized" operating hovers around D.

Using the Biot-Savart Law, the supplied current (I) length (a) and radius (r) of the secondary, outer winding coil 420 permits the system to calculate a "Beta" (β) for the coil based on the permeability of the sensor transducer core 436 (μ0) and the turn-density, turns per inch (dl) per the below calculation (Biot-Savart):

$$= \oint \frac{\mu_0}{4\pi} \left[ \frac{Idl}{r^2 + a^2} \right] \cdot \frac{a}{\sqrt{r^2 + a^2}}$$

The result is a constant value ("Beta" (β)) for that magnetic sensor transducer 404 that allows the calculation of the output voltage (0.0195 volts per setting). Using Ohms Law (V=IR), in conjunction with the precision 100 ohm resistor as ground 435 from the first end of the secondary, over-winding coil 420 to ground, the system calculates the current (I) per setting (β/100 Ohms=Current) to allow the calculation of a precise value of Tesla, or more specifically, in an implemented case, milli-Tesla (mT), per setting on the digitally controlled potentiometer 432. This step calculates the conversion of the non-linear response of frequency to the known mT value for that specific potentiometer setting.

Figure 18:
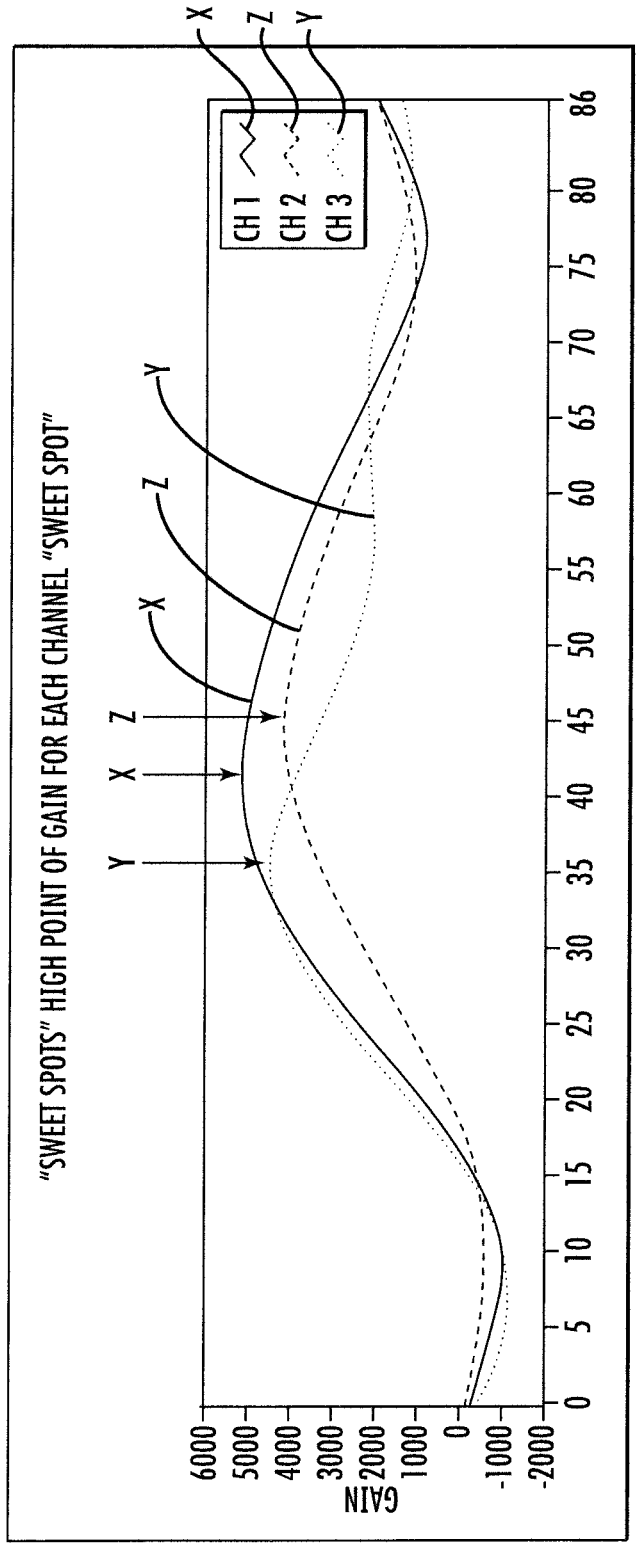
FIG. 18 is a graph showing the gain plot as a change in milliTesla per kilohertz change in the sensor calculated for each of three (X, Y and Z) axes from the sweep of the transducer over 256 settings.

Each resultant data point collected from the frequency scan is analyzed as a function of the change in mT (calculated from the change in frequency, the β and the 100 Ohm resistor) as a function of change in frequency per potentiometer setting. This provides a Gain plot of the change in mT per (ΔmT/kHz) per potentiometer setting to determine which potentiometer setting results in the maximum amount of response/change in the sensor transducer. The graph in FIG. 18 shows an example plot that is automatically derived from the sensor's Gain (ΔmT/kHz) as a function of potentiometer setting where the Gain (change in milliTesla per kilohertz change in the sensor) plot is calculated for each of the three (X, Y and Z) axes from the sweep of the transducer over the 256 settings from negative 2.5V to positive 2.5V using the resultant milliTesla calculation that Biot-Savart equation provided. The high point of the curve for each of the X, Y and Z axes corresponds to the "sweet spot" and the high point of gain for each channel.

Once the Gain plot is calculated, the software automatically picks the potentiometer setting where the Gain is at the maximum value for each channel independently. The three potentiometer values are set by the microprocessor/software or controller 430 and locked into that value as a center point, or what may be referred to as the "sweet spot." The controller 430 and software then calculates the linearization of curve surrounding the "sweet spot" by a 6th order polynomial-fit of the area. What area around the curve is polynomial-fit is a software-defined variable of the amount of potentiometer settings adjacent to the "sweet spot." The implemented case presently is 10 potentiometer settings higher and 10 potentiometer settings lower. This number may be changed depending on the desired bandwidth that is required. These polynomial fit calculations are stored in a configuration file within the memory, along with the other calculated values, including the "sweet spots," lower and upper frequency bounds (defined by the 10 potentiometer settings above and below the sweet spot) and stored in a non-volatile format. The polynomial fit acts as a translation function of the frequency output of the magnetic sensor transducer 404 and the resultant value in quantified magnetic units (Tesla) over the software defined upper and lower frequency range.

This provides a quantitative output reading of the magnetic sensor transducer 404 (for each and all channels/axes individually) that are updated at the sampling rate of the sensor network/system (as implemented at 10 Hz/100 ms). If the environment changes such that the frequency response of the sensors no longer fit the calculated translation function, or if the frequency is outside of the upper and lower limits, the software automatically indicates that the sensor transducer(s) are out of calibration.

The low-dropout (LDO) regulators 440, 442 each may be a DC linear voltage regulator, which may regulate the output voltage even when the supply voltage is close to the output voltage. These devices have advantages over other DC to DC regulators because they have an absence of switching noise and a smaller device size that is advantageous for these types of sensors as described. It should be understood that other hardware components may be used such as described relative to FIG. 5 in the incorporated by reference '228 patent, and may include the operating system, applications, different models and data that work with a computer peripherals such as computer readable media, including one or more processors, the computer usable memory such as ROM, or volatile memory, such as RAM, a data storage unit and signal generating and receiving circuitry. These circuits may interoperate through a bus into a display, an alphanumeric input, a cursor control, different input/output devices, and communications interfaces.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A magnetic field monitor for monitoring magnetic field fluctuations occurring in an environment, comprising:
    a magnetic field sensor configured to generate an electronic signal at a time period representing a magnetic field of the environment, said magnetic field sensor comprising,
        a sensor transducer having a sensor bobbin and a primary coil wound thereon and including first and second ends, and a secondary, over-winding coil including first and second ends;
        a sensor circuit connected to the first end of the primary coil;
        a controller connected to the second end of the primary coil; and
        a digitally controlled potentiometer connected to the first end of the secondary coil and operatively connected to the controller; and
    a self-calibrating module connected to the magnetic field sensor, comprising,
        a calibrator connected to the magnetic field sensor and configured to generate a relative baseline signal based on an average value of electronic signals generated at previous time periods to represent the magnetic field of the environment; and
        a comparator connected to the calibrator and configured to determine a difference between the relative baseline signal and electronic signal and generate a calibrated output signal if the difference is greater than or equal to a threshold; and
        when a calibrated output signal is not generated, the controller and digitally controlled potentiometer are configured to operate the sensor transducer to obtain a quantitative linear output.

2. The magnetic field monitor according to claim 1 wherein said digitally controlled potentiometer is configured to sweep a voltage from negative to positive over the secondary, over-winding coil and provide a changing voltage to the secondary, over-winding coil, wherein each different voltage produces a current that changes the output frequency of the sensor transducer.

3. The magnetic field monitor according to claim 2 further comprising a positive and a negative low drop-out (LDO) voltage regulator connected to said digitally controlled potentiometer.

4. The magnetic field monitor according to claim 2 wherein the voltage to the secondary, over-winding coil approaches zero at the midpoint of the potentiometer voltage sweep.

5. The magnetic field monitor according to claim 1 comprising an electronic ground having a tolerance resistor and connected to the second end of the secondary, over-winding coil.

6. The magnetic field monitor according to claim 1 wherein said controller is configured to generate a sensor response curve and convert a non-linear output of the sensor transducer to the quantitative linear output.

7. The magnetic field monitor according to claim 1 wherein the controller is configured to update a sampling rate of the magnetic field sensor.

8. The magnetic field monitor according to claim 1 wherein said magnetic field sensor comprises a multi-axis magnetic field sensor having primary axes oriented in different positions relative to magnetic North and having a non-linear output channel at each axis.

9. The magnetic field monitor according to claim 1 wherein said controller comprises a counter, a signal processing circuit, a serial peripheral interface (SPI) connected to said digitally controlled potentiometer and a universal asynchronous receiver-transmitter (UART) for software control.

10. The magnetic field monitor according to claim 1 further comprising a plurality of magnetic field sensors, a calibrator connected to each of the magnetic field sensors and configured to generate the relative baseline signal based on an average value of the electronic signals from each of the magnetic field sensors.

11. The magnetic field monitor according to claim 10, comprising:
a sensor input/output controller connected to said self-calibrating module and having a signal combiner to combine the electronic signals from the plurality of magnetic field sensors into a single electronic signal; and
a sensor event assessor connected to the sensor input/output controller and configured to receive and process the single electronic signal to provide assessment information about a sensed event.

12. A magnetic field monitor for monitoring magnetic field fluctuations occurring in an environment, comprising:
a magnetic field sensor configured to generate an electronic signal at a time period representing a magnetic field of the environment and comprises:
a sensor transducer having a sensor bobbin;
a primary coil wound on the sensor bobbin, the primary coil having first and second ends;
a secondary, over-winding coil wound over the primary coil, said secondary, over-winding coil including first and second ends;
a sensor circuit connected to the first end of the primary coil;
a controller connected to the second end of the primary coil;
a digitally controlled potentiometer connected to the first end of the secondary, over-winding coil and operatively connected to the controller; and
a positive and a negative voltage source connected to said digitally controlled potentiometer, wherein said digitally controlled potentiometer is configured to sweep a voltage from negative to positive over the secondary, over-winding coil and provide a changing voltage to the secondary, over-winding coil, wherein each different voltage produces a current that changes the output frequency of the sensor transducer, and wherein said controller is configured to generate a sensor response curve and convert a non-linear output of the sensor transducer to a quantitative linear output.

13. The magnetic field monitor according to claim 12 wherein said positive and negative voltage source comprise a positive and negative low drop-out (LDO) voltage regulator connected to said digitally controlled potentiometer.

14. The magnetic field monitor according to claim 12 wherein the voltage to the secondary, over-winding coil approaches zero at the midpoint of the potentiometer sweep.

15. The magnetic field monitor according to claim 12 wherein the sweep of the voltage at said digitally controlled potentiometer is from about negative 2.5 volts to about positive 2.5 volts.

16. The magnetic field monitor according to claim 12 comprising an electronic ground having a tolerance resistor and connected to the second end of the secondary, over-winding coil.

17. The magnetic field monitor according to claim 12 wherein the controller is configured to update a sampling rate of the magnetic field sensor.

18. The magnetic field monitor according to claim 12 further comprising a multi-axis magnetic field sensor unit having primary axes oriented in different positions relative to magnetic North and having a non-linear output channel at each axis.

19. The magnetic field monitor according to claim 18 wherein the controller is configured to set the digitally controlled potentiometer having a gain at a maximum value for each channel independently.

20. The magnetic field monitor according to claim 12 wherein said controller comprises a counter, a signal processing circuit, a serial peripheral interface (SPI) connected to said digitally controlled potentiometer and a universal asynchronous receiver-transmitter (UART) for software control.

21. A method of monitoring magnetic field fluctuations occurring in an environment, comprising:
providing a magnetic field sensor comprising a sensor transducer having a sensor bobbin, a primary coil wound on the sensor bobbin, the primary coil having first and second ends, a secondary, over-winding coil wound over the primary coil, said secondary, over-winding coil including first and second ends, a sensor circuit connected to the first end of the primary coil, a controller connected to the second end of the primary coil, and a digitally controlled potentiometer connected to the first end of the secondary, over-winding coil and operatively connected to the controller;
sweeping a voltage from positive to negative at the digitally controlled potentiometer and over the secondary, over-winding coil to provide a changing negative to positive voltage at the secondary, over-winding coil, wherein each different voltage produces a current that changes the output frequency of the sensor transducer to produce a non-linear output; and
generating at the controller a sensor response curve and converting the non-linear output of the sensor transducer to a quantitative linear output.

22. The method according to claim 21 wherein the voltage to the secondary, over-winding coil approaches zero at the midpoint of the potentiometer voltage sweep.

23. The method according to claim 21 wherein said magnetic field sensor comprises a multi-axis magnetic field sensor having primary axes, the method including orienting each axis in a different position relative to magnetic North and producing a non-linear output channel at each axis.

24. The method according to claim 21 further comprising setting the potentiometer to have a gain at a maximum value for each channel independently.

* * * * *